United States Patent
Kawashima

(10) Patent No.: US 12,107,138 B2
(45) Date of Patent: Oct. 1, 2024

(54) SEMICONDUCTOR DEVICE AND METHOD OF MANUFACTURING THE SAME

(71) Applicant: RENESAS ELECTRONICS CORPORATION, Tokyo (JP)

(72) Inventor: Yoshiyuki Kawashima, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 59 days.

(21) Appl. No.: 18/059,603

(22) Filed: Nov. 29, 2022

(65) Prior Publication Data

US 2023/0275139 A1    Aug. 31, 2023

(30) Foreign Application Priority Data

Feb. 25, 2022  (JP) ................. 2022-027446

(51) Int. Cl.
| | |
|---|---|
| H01L 29/66 | (2006.01) |
| H01L 21/28 | (2006.01) |
| H01L 29/51 | (2006.01) |
| H01L 29/78 | (2006.01) |

(52) U.S. Cl.
CPC ...... *H01L 29/516* (2013.01); *H01L 29/40111* (2019.08); *H01L 29/6684* (2013.01); *H01L 29/78391* (2014.09)

(58) Field of Classification Search
CPC ............. H01L 29/516; H01L 29/40111; H01L 29/6684; H01L 29/78391; H01L 29/512
USPC ......................................................... 257/295
See application file for complete search history.

(56) References Cited

U.S. PATENT DOCUMENTS

| | | | |
|---|---|---|---|
| 10,998,408 B2 | 5/2021 | Yamaguchi | |
| 2002/0083959 A1* | 7/2002 | Morita | H01L 29/513 438/723 |
| 2003/0201497 A1* | 10/2003 | Inoue | H01L 29/802 257/369 |
| 2004/0094791 A1* | 5/2004 | Ito | H01L 28/55 257/295 |
| 2005/0017269 A1* | 1/2005 | Miyazawa | H01L 28/55 257/E21.664 |
| 2006/0030057 A1* | 2/2006 | Hayashi | H01L 28/55 257/295 |
| 2009/0050949 A1* | 2/2009 | Maruyama | H01L 29/6684 257/295 |

(Continued)

FOREIGN PATENT DOCUMENTS

JP    2019-201172 A    11/2019

*Primary Examiner* — Sheikh Maruf
(74) *Attorney, Agent, or Firm* — Rimon P.C.

(57) ABSTRACT

To improve a reliability of a nonvolatile memory cell including a ferroelectric film. The nonvolatile memory cell MC includes a paraelectric film IL formed on a semiconductor substrate SUB, the ferroelectric film FE formed on the paraelectric film IL, a gate electrode GE formed on the ferroelectric film FE, a high dielectric constant film HK formed on the ferroelectric film FE such that the high dielectric constant film HK cover side surfaces of the gate electrode GE, and a source region SR and a drain region DR formed in an upper surface of the semiconductor substrate SUB such that the ferroelectric film FE is sandwiched between the source region SR and the drain region DR. A relative dielectric constant of the high dielectric constant film HK is higher than a relative dielectric constant of the ferroelectric film FE.

6 Claims, 22 Drawing Sheets

A – A cross-sectional view

(56) References Cited

U.S. PATENT DOCUMENTS

| | | | |
|---|---|---|---|
| 2011/0140238 A1* | 6/2011 | Natori | H01L 28/56 |
| | | | 257/532 |
| 2015/0085888 A1* | 3/2015 | Ae | H01S 5/3202 |
| | | | 438/39 |
| 2016/0005749 A1* | 1/2016 | Li | H10B 41/30 |
| | | | 257/295 |
| 2018/0240804 A1* | 8/2018 | Yoo | H01L 21/28088 |
| 2019/0207009 A1* | 7/2019 | Yamaguchi | H01L 29/6684 |
| 2021/0035990 A1* | 2/2021 | Lee | H10B 43/35 |
| 2021/0043654 A1* | 2/2021 | Yoo | G11C 11/223 |

* cited by examiner

FIG. 5

| | Vg | Vd | Vs | Vsub |
|---|---|---|---|---|
| WRITE OPERATION | -5 | 0 | 0 | 0 |
| ERASE OPERATION | 5 | 0 | 0 | 0 |
| READ OPERATION | 1 | 1 | 0 | 0 |

A–A cross-sectional view

A—A cross-sectional view

A—A cross-sectional view

SEMICONDUCTOR DEVICE AND METHOD OF MANUFACTURING THE SAME

CROSS-REFERENCE TO RELATED APPLICATIONS

The disclosure of Japanese Patent Application No. 2022-027446 filed on Feb. 25, 2022, including the specification, drawings and abstract is incorporated herein by reference in its entirety.

BACKGROUND

The present disclosure relates to a semiconductor device and a method of manufacturing the same, and more particularly, to the semiconductor device having a nonvolatile memory cell including a ferroelectric film, and a method of manufacturing the same.

In recent years, the nonvolatile memory cell using the ferroelectric film such as a HfZrO2 film (commonly called as a HZO film) have been developed. As a structure of such a memory cell, a MIS-FET (Metal Insulator Semiconductor—Field Effect Transistor) structure in which the HZO film is formed on a gate dielectric film of the MIS-FET, or a MIS-FET structure in which a metal film is formed between the gate dielectric film and the HZO film has been proposed. For example, Japanese Patent Laid-Open No. JP-A-2019-201172 (Patent Document 1) discloses a memory cell having the MFIS-FET structure.

SUMMARY

FIGS. 1 and 2 are the nonvolatile memory cell of the MFIS-FET studied by the inventor of this application, and they are the nonvolatile memory cell in studied example. Note that FIG. 2 is an enlarged view of a vicinity of an end of the ferroelectric film FE in FIG. 1.

In case of the nonvolatile memory cell is an n-type FET, a write operation and an erase operation of the nonvolatile memory cell are as follows. In the write operation, by applying a negative bias to a gate electrode GE, a polarization direction in the ferroelectric film FE becomes upward, and a threshold voltage increases. On the other hand, in the erase operation, by applying a positive bias to the gate electrode GE, the polarization direction in the ferroelectric film FE becomes downward, and the threshold-voltage decreases.

Such the nonvolatile memory cell is manufactured as follows. First, a paraelectric film IL, the metal film MF, an amorphous HZO film, and the gate electrode GE are sequentially deposited on a semiconductor substrate SUB. Next, the amorphous HZO film is processed to a heat treatment at 600 to 800° C. to form an orthorhombic crystal HZO film. Since the HZO film having an orthorhombic crystal has ferroelectricity, the HZO film having the orthorhombic crystal can be used as the ferroelectric film FE.

Next, the paraelectric film IL, the ferroelectric film FE, and the gate electrode GE are patterned by using a mask pattern such as a resist pattern. Here, when the ferroelectric film FE is patterned, a plasma-etching is performed. Therefore, as shown in FIG. 2, a side surface of the ferroelectric film FE is exposed to plasma and left a part of the ferroelectric film FE as a characteristic-variation portion FEa.

The inventor of this application has found a possibility that a polarization does not change at a place where such the characteristic-variation portion FEa is existed. That is, if there is a portion where the polarization does not change, it may not be possible to determine whether the nonvolatile memory cell is in a write state or an erase state during a read operation, and there is a problem that a reliability of the nonvolatile memory cell may degrade.

In recent years, it has been desired to fabricate the nonvolatile memory cell by a fine process, for example, a gate length of 40 nm or less. Since the ferroelectric film FE is located directly under the gate electrode GE, a ratio of the characteristic-variation portion FEa in the ferroelectric film FE increases as miniaturization advances. That is, as miniaturization advances, there is a problem that a region where the polarization does not change increases. Therefore, a technique for solving such problem is required.

Other objects and novel features will become apparent from the description of this specification and the accompanying drawings.

In one embodiment, the semiconductor device comprises nonvolatile memory cells. The nonvolatile memory cell includes: a paraelectric film formed over a semiconductor substrate; a ferroelectric film formed over the paraelectric film; a gate electrode formed over the ferroelectric film; a high dielectric constant film formed over the ferroelectric film such that the high dielectric constant film covers side surfaces of the gate electrode; and a source region and a drain region formed in an upper surface of the semiconductor substrate such that the ferroelectric film is sandwiched between the source region and the drain region in plan view. Here, a relative dielectric constant of the high dielectric constant film is higher than a relative dielectric constant of the ferroelectric film.

In one embodiment, a method of manufacturing a semiconductor device which comprises nonvolatile memory cells includes: (a) forming a paraelectric film on a semiconductor substrate; (b) forming a ferroelectric film over the paraelectric film; (c) forming a conductive film on the ferroelectric film; (d) forming a gate electrode by patterning the conductive film; (e) forming a high dielectric constant film over the ferroelectric film so as to cover the gate electrode; (f) removing a part of the high dielectric constant film so as to remain an other part of the high dielectric constant film on side surfaces of the gate electrode by an anisotropic plasma etching; (g) removing a part of the ferroelectric film exposed from the gate electrode and the high dielectric constant film; (h) patterning the paraelectric film; and (i) forming a source region and a drain region in an upper surface of the semiconductor substrate so as to sandwich the ferroelectric film in plan view. Here, a relative dielectric constant of the high dielectric constant film is higher than a relative dielectric constant of the ferroelectric film.

According to these embodiments, it is possible to improve the reliability of the nonvolatile memory cell including the ferroelectric film.

BRIEF DESCRIPTION OF THE DRAWINGS

FIG. 5 is a table showing applied voltages of each operation of the nonvolatile memory cell in the first embodiment.

DETAILED DESCRIPTION

Figure 1:
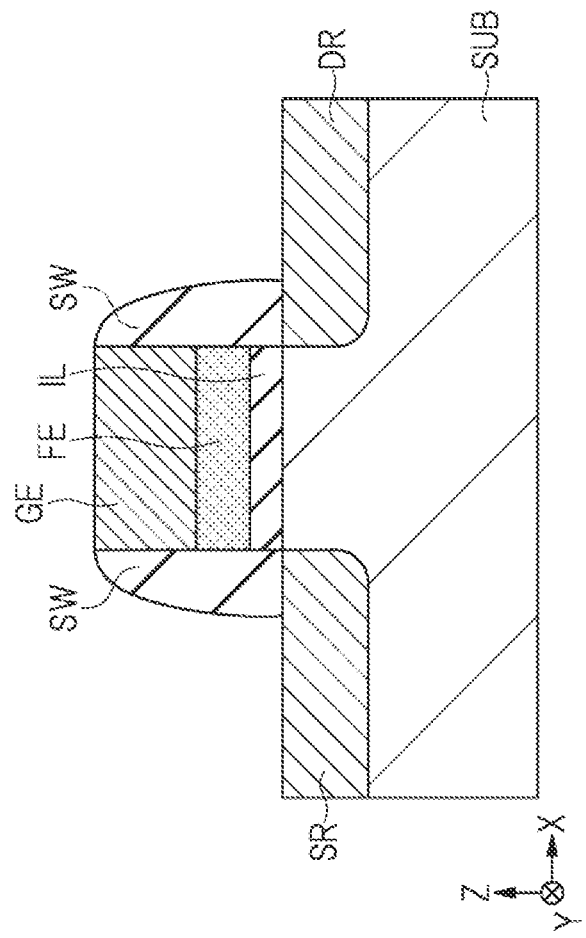
FIG. 1 is a cross-sectional view showing a semiconductor device having a nonvolatile memory cell in studied example.
Figure 2:
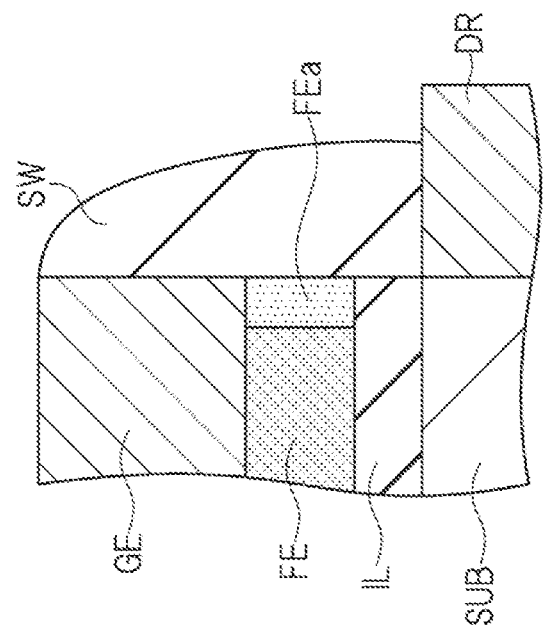
FIG. 2 is an enlarged view of a portion of the nonvolatile memory cell in studied example.

In all the drawings for explaining the embodiments, members having the same functions are denoted by the same reference numerals, and repetitive descriptions thereof are omitted. In the following embodiments, descriptions of the same or similar parts will not be repeated in principle except when particularly necessary.

In addition, the X direction, the Y direction, and the Z direction described in this application intersect each other and are orthogonal to each other. In this application, the Z direction is described as a vertical direction, an up-down direction, a height direction, or a thickness direction of a certain structure. The expression "in plan view" described in this application means that a plane constituted by the X direction and the Y direction is viewed from the Z direction. In addition, expressions such as "1 to 3 nm" in the numerical ranges described in this application mean "equal to or more than 1 nm and equal to or less than 3 nm".

First Embodiment

Configuration of a Nonvolatile Memory Cell of a Semiconductor Device

Figure 3:
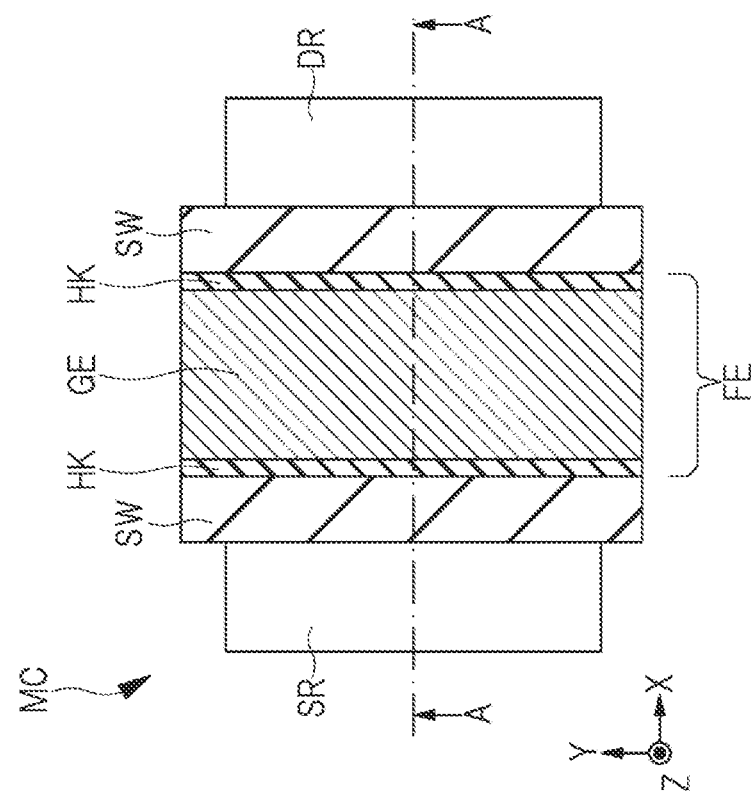
FIG. 3 is a plan view showing a semiconductor device having a nonvolatile memory cell in a first embodiment.
Figure 4:
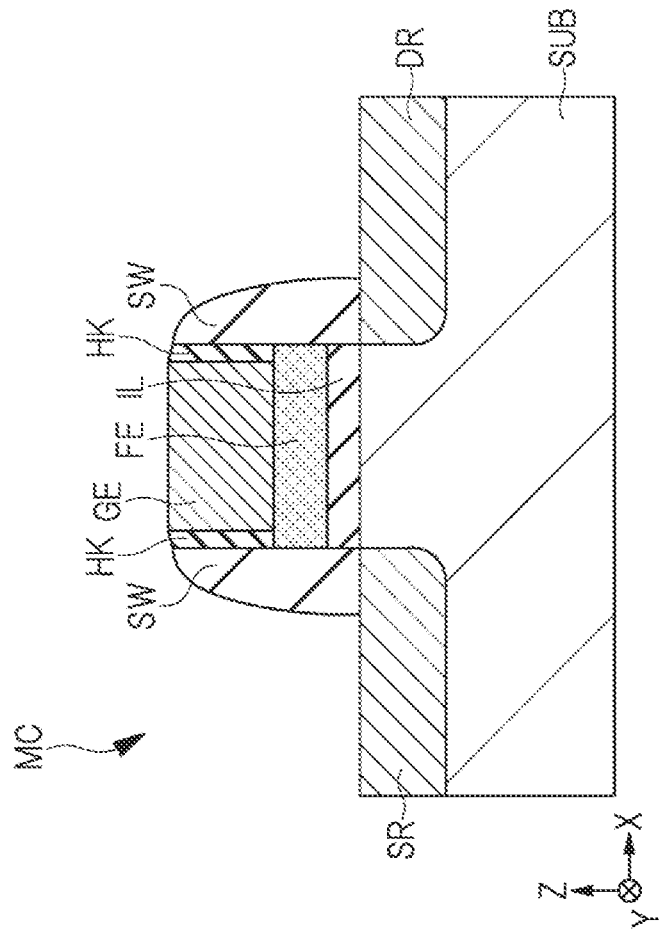
FIG. 4 is a cross-sectional view showing the semiconductor device having the nonvolatile memory cell in the first embodiment.

Hereinafter, An outline of a semiconductor device in a first embodiment will be described with reference to FIGS. 3 and 4. FIG. 3 is a plan view showing the semiconductor device having a nonvolatile memory cell MC. FIG. 4 is a cross-sectional view along A-A line of FIG. 3.

The semiconductor device is, for example, a semiconductor chip, and includes a plurality of nonvolatile memory cells MC and the like. The nonvolatile memory cell MC is a ferroelectric memory cell having the MFIS-FET structure, and is the n-type FET.

As shown in FIGS. 3 and 4, the nonvolatile memory cell MC includes a semiconductor substrate SUB, a paraelectric film IL, a ferroelectric film FE, a gate electrode GE, a high dielectric constant film HK, sidewall spacers SW, a source region SR, and a drain region DR.

The semiconductor substrate SUB is made of a p-type monocrystalline silicon having a resistivity of, for example, about 1 to 10 Ωcm. The paraelectric film IL is formed on the semiconductor substrate SUB and is, for example, a silicon oxide film. A thickness of the paraelectric film IL is, for example, 1 to 5 nm.

The ferroelectric film FE is formed on the paraelectric film IL and is, for example, an orthorhombic crystal HfO2 film or an orthorhombic crystal HfO2 film doped with at least one of zirconium (Zr), silicon (Si), nitrogen (N), carbon (C), and aluminum (Al). More preferably, the ferroelectric film FE is an orthorhombic crystal HfZrO2 film. A thickness of the ferroelectric film FE is, for example, 4 to 16 nm, and more preferably 10 nm. A relative dielectric constant of the ferroelectric film FE is about 30.

The gate electrode GE is formed on the ferroelectric film FE, and is, for example, an n-type polysilicon film. The gate electrode GE may be a metal film such as a titanium nitride film, an aluminum film, or a tungsten film, or may be a laminated film in which these metal films are appropriately laminated. A thickness of the gate electrode GE is, for example, 50 to 200 nm. Further, a gate length of the nonvolatile memory cell MC is equal to or less than 40 nm. Note that the gate length is a length of the gate electrode GE in a direction (X direction) from the drain region DR toward the source region SR.

The sidewall spacers SW is formed on the semiconductor substrate SUB so as to cover side surfaces of the gate electrode GE, side surfaces of the ferroelectric film FE, and side surfaces of the paraelectric film IL. The sidewall spacers SW is formed of, for example, the silicon oxide film or a silicon nitride film. The sidewall spacers SW may be a laminated film of the silicon oxide film and the silicon nitride film.

In the nonvolatile memory cell MC, the semiconductor substrate SUB located directly under the ferroelectric film FE becomes as a channel region. The source region SR and the drain region DR are formed in an upper surface of the semiconductor substrate SUB so as to sandwich the channel region. In other words, the source region SR and the drain region DR are formed so as to sandwich the ferroelectric film FE in plan view. The source region SR and the drain region DR are impurity doped regions into which impurities exhibiting n-type conductivity, such as arsenic (As) or phosphorus (P), is doped.

In the first embodiment, the high dielectric constant film HK is formed on the ferroelectric film FE so as to cover the side surfaces of the gate electrode GE. The high dielectric constant film HK is located between the side surfaces of the gate electrode GE and the sidewall spacers SW. A relative dielectric constant of the high dielectric constant film HK is higher than the relative dielectric constant of the ferroelectric film FE, and is about 80. Such the high dielectric constant film HK is, for example, a titanium oxide film (TiO2 film). And a length of the high dielectric constant film HK in a gate length direction (X direction) is, for example, 10 to 20 nm.

In the first embodiment, since the high dielectric constant film HK is formed on the side surfaces of the gate electrode GE, an area of the ferroelectric film FE and an area of the paraelectric film IL are larger than an area of the gate electrode GE in plan view. In other words, in the gate length direction (X direction), the length of the ferroelectric film FE and the length of the paraelectric film IL are longer than the length of the gate electrode GE.

(Each Operation of the Nonvolatile Memory Cell MC)

Hereinafter, the write operation, the erase operation, and a read operation of the nonvolatile memory cell MC will be described with reference to FIGS. 5 and 6.

FIG. 5 shows applied voltages at respective operations of the nonvolatile memory cell MC. A gate voltage Vg is applied to the gate electrode GE, a source voltage Vs is applied to the source region SR, a drain voltage Vd is applied to the drain region DR, and a back gate voltage Vsub is applied to the semiconductor substrate SUB.

Figure 6:
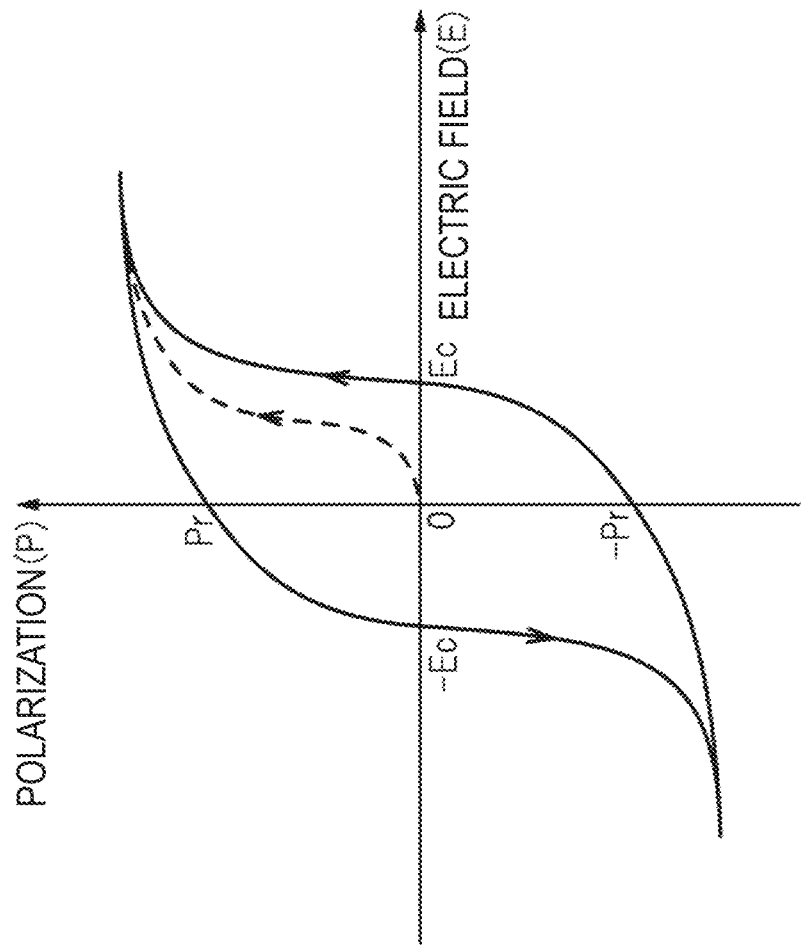
FIG. 6 is a graph showing a relationship between an intensity of an electric field and a magnitude of a polarization in a ferroelectric film.

FIG. 6 is a graph showing a strength of an electric field received by the ferroelectric film FE and a magnitude of polarization held in the ferroelectric film FE when the respective voltages shown in the write operation and the erase operation of FIG. 5 are applied to the nonvolatile memory cell MC.

The ferroelectric film FE is known to have following features. First, the relative dielectric constant of the ferroelectric film FE is greatly changed by an external electric field (E). Next, even if the external electric field (E) becomes zero, the polarization (P) is maintained in the ferroelectric film FE. Furthermore, the magnitude of the polarization (P) varies depending on a manner (history) of a change of the external electric field (E). These features are shown in the graph called a hysteresis loop as in FIG. 6.

First, as shown by a broken line in FIG. 6, a positive external electric field is applied from a state in which the external electric field (E) is not applied to the ferroelectric film FE and the magnitude of the polarization (P) is zero. When the external electric field (E) is gradually increased from zero, a positive polarization begins to increase slightly at a beginning and begins to rise sharply at a certain electric field value. As the positive external electric field is further enhanced, a positive polarization saturates at a constant value. After confirming that the positive polarization tends to saturate, the positive external electric field is weakened, and the external electric field (E) is set to zero. Then, the positive polarization remains as a positive residual polarization (Pr) at a point slightly lower the maximum value. This positive residual polarization (Pr) is the magnitude of the polarization held in the ferroelectric film FE.

Note that, the ferroelectric film FE once polarized does not follow a path indicated broken line in FIG. 6, but follows the hysteresis loop of a solid line in FIG. 6. That is, the following polarization changes occur in the ferroelectric film FE.

When a negative external electric field is applied from a state in which the external electric field (E) is zero and the positive residual polarization (Pr) is held in the ferroelectric film FE, the polarization starts to decrease. The polarization begins to decrease hardly at a beginning, but at a certain electric field value, begins to decrease sharply. And then, when the negative external electric field reaches a certain strength (a coercive electric field—Ec), the polarization become zero. As the negative external electric field is further enhanced, a negative polarization saturates at a constant value. After confirming that the negative polarization tends to saturate, the negative external electric field is weakened, and the external electric field (E) is set to zero. Then, the negative polarization remains as a negative residual polarization (−Pr) at a point slightly higher the maximum value. This negative residual polarization (−Pr) is the magnitude of the polarization held in the ferroelectric film FE.

When the positive external electric field is applied from a state in which the external electric field (E) is zero and the negative residual polarization (−Pr) is held in the ferroelectric film FE, the polarization starts to increase. The polarization begins to increase hardly at a beginning, but at a certain electric field value, begins to increase sharply. And then, when the positive external electric field reaches a certain strength (a coercive electric field Ec), the polarization become zero. As the positive external electric field is further enhanced, the positive polarization saturates at a constant value. After confirming that the positive polarization tends to saturate, the positive external electric field is weakened, and the external electric field (E) is set to zero. Then, the positive polarization remains as the positive residual polarization (Pr) at a point slightly lower the maximum value. This positive residual polarization (Pr) is also the magnitude of the polarization held in the ferroelectric film FE.

Here, a case where the magnitude of the polarization of the ferroelectric film FE is the positive residual polarization (Pr), it is referred to as an "erase state". And the case where the magnitude of the polarization of the ferroelectric film FE is the negative residual polarization (−Pr), it is referred to as a "write state". The threshold voltage of the nonvolatile memory cell MC in the write state is higher than the threshold voltage of the nonvolatile memory cell MC in the erase state. Note that, when the magnitude of the polarization is positive residual polarization (Pr), it can be said that a direction of the polarization is upward, and when the magnitude of the polarization is negative residual polarization (−Pr), it can be said that a direction of the polarization is downward.

A voltage applied to the gate electrode GE during the read operation is set to be lower than the threshold voltage of the nonvolatile memory cell MC in the write state and higher than the threshold voltage of the nonvolatile memory cell MC in the erase state. As a result, in the write state, a current does not flow in the nonvolatile memory cell MC, but, in the erase state, the current flows in the nonvolatile memory cell MC. In this manner, a state of the nonvolatile memory cell MC is read based on the magnitude of the current flowing through the nonvolatile memory cell MC.

Main Features of the First Embodiment

Figure 7:
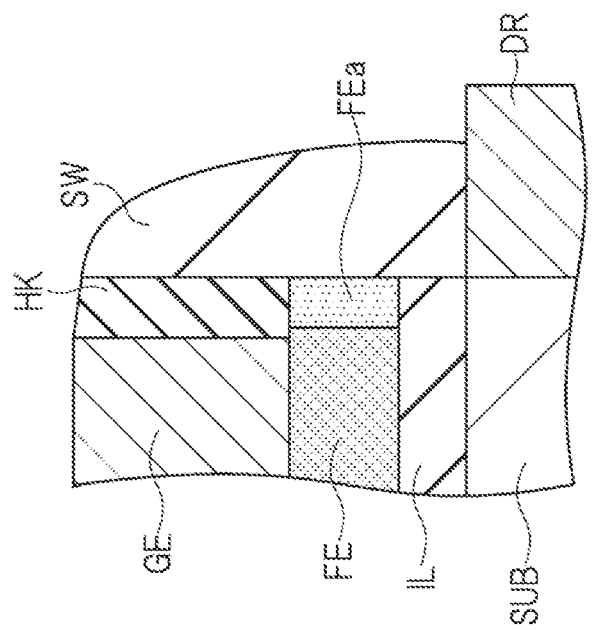
FIG. 7 is an enlarged view of a portion of the nonvolatile memory cell in the first embodiment.
Figure 8:
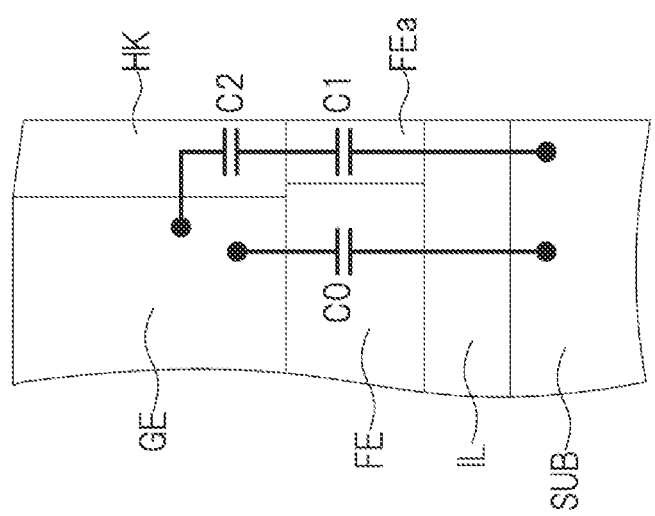
FIG. 8 is a schematic diagram for explaining a capacitance between a gate electrode and a semiconductor substrate in the first embodiment.

Hereinafter, main features of the first embodiment will be described with reference to FIGS. 7 and 8. FIG. 7 is an enlarged view of the vicinity of an end portion of the ferroelectric film FE of FIG. 4. FIG. 8 is a schematic diagram for explaining a capacitance between the gate electrode GE and the semiconductor substrate SUB.

As shown in FIG. 7, in the first embodiment, similarly to the studied example, a characteristic-variation portion FEa is formed on the side surfaces of the ferroelectric film FE. As will be described in detail later, the characteristic-variation portion FEa in the first embodiment is formed by exposing the ferroelectric film FE to plasma when the ferroelectric film FE is performed to a plasma-etching by using the gate electrode GE and the high dielectric constant film HK as masks.

Since the ferroelectric film FE is patterned in this way, in the first embodiment, the characteristic-variation portion FEa is located directly under the high dielectric constant film HK, and an upper surface of the characteristic-variation portion FEa is covered with the high dielectric constant film HK. That is, in the studied example, the characteristic-variation portion FEa is located directly under the gate electrode GE. But in the first embodiment, the characteristic variation portion FEa is formed at a position away from the side surfaces of the gate electrode GE.

In the characteristic-variation portion FEa, even if a predetermined voltage is applied to the gate electrode GE, the magnitude of the polarization is hardly to change. A cause of the formation of the characteristic variation portion FEa is presumed to be that an element contained in etching gases used for the plasma-etching is mixed into the ferroelectric film FE as an impurity. As another cause, it is presumed that a crystallinity of the characteristic variation portion FEa exposed to plasma is different from a crystallinity of the ferroelectric film FE.

Further, if the magnitude of the polarization of the characteristic-variation portion FEa does not change, a portion of the channel region directly under the characteristic variation portion FEa is exist as a resistive component. For example, when the nonvolatile memory cell MC is in the erase state, the channel region directly under the ferroelectric film FE is in a state in which current easily flows, but the current hardly flows directly under the characteristic-variation portion FEa. Therefore, there is a possibility that an accurate read operation cannot be performed.

Here, it is possible that if a large voltage can be applied to the characteristic-variation portion FEa, a large electric field can be generated directly under the characteristic-variation portion FEa, regardless of the magnitude of the polarization of the characteristic-variation portion FEa. Therefore, since the current can easily flow directly in the under the characteristic-variation portion FEa, it becomes easier to operate an accurate reading operation.

As shown in FIG. 8, in directly under the gate electrode GE, the capacitance between the gate electrode GE and the semiconductor substrate SUB is represented by a capacitance C0 of the ferroelectric film FE. On the other hand, at a position away from the side surfaces of the gate electrode GE, the capacitance between the gate electrode GE and the semiconductor substrate SUB is represented by a combined capacitance in series connection of a capacitance C1 of the characteristic-variation portion FEa and a capacitance C2 of the high dielectric constant film HK. Here, when the gate voltage Vg is applied to the gate electrode GE, a voltage V1 applied to the characteristic-variation portion FEa can be calculated as in the following Equation 1.

$$V1 = \{C2/(C1+C2)\}Vg:$$ Equation 1

Therefore, when the capacitance C2 is increased, the voltage V1 applied to the characteristic-variation portion FEa can be increased. Therefore, in the first embodiment, in order to increase the capacitance C2, the relative dielectric constant (about 80) of the high dielectric constant film HK is higher than the relative dielectric constant (about 30) of the ferroelectric film FE. Note that, the relative dielectric constant of the high dielectric constant film HK is higher than a relative dielectric constant of the silicon oxide film (about 3.9) constituting the sidewall spacers SW or a relative dielectric constant of the silicon nitride film (about 7.8).

As described above, by covering the characteristic-variation portion FEa with the high dielectric constant film HK, it is easy to perform the accurate reading operation even when the magnitude of the polarization of the characteristic-variation portion FEa is difficult to change. That is, according to the first embodiment, a reliability of the nonvolatile memory cell MC can be improved.

A Manufacturing Method of the Semiconductor Device

Hereinafter, a manufacturing method of the semiconductor device in the first embodiment will be described with reference to FIGS. 9 to 13.

Figure 9:
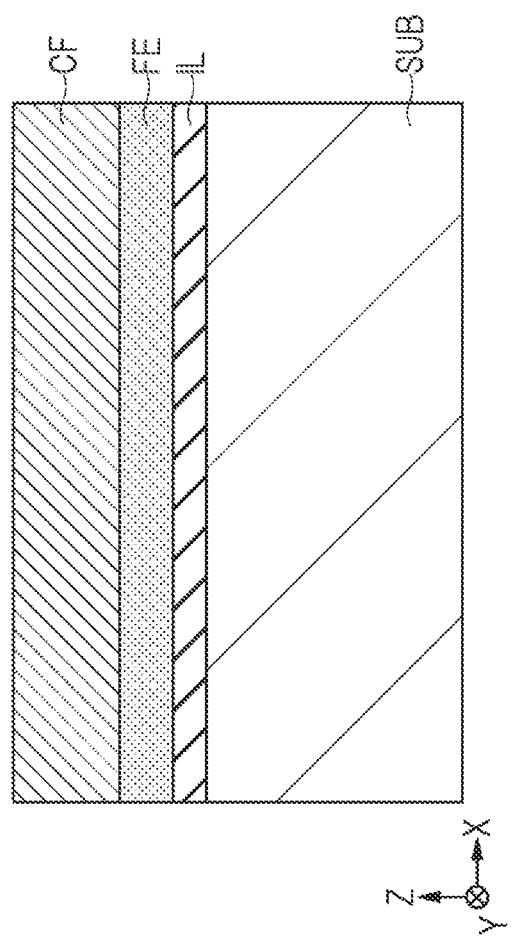
FIG. 9 is a cross-sectional view showing a manufacturing method of the semiconductor device in the first embodiment.

As shown in FIG. 9, first, the semiconductor substrate SUB is prepared. Next, the paraelectric film IL is formed on the semiconductor substrate SUB by, for example, thermal oxidation or ISSG oxidation. Next, the ferroelectric film FE is formed on the paraelectric film IL by, for example, ALD method. At this time, the ferroelectric film FE is in an amorphous state.

Next, a conductive film CF is formed on the ferroelectric film FE by, for example, CVD method or sputtering method. The conductive film CF is, for example, a polysilicon film. The conductive film CF may be the metal film such as the titanium nitride film, the aluminum film, or the tungsten film, or may be a laminated film obtained by appropriately laminating these metal films. Next, the ferroelectric film FE is crystallized by processing the amorphous state of the ferroelectric film FE to the heat treatment at 600 to 800° C. As a result, the ferroelectric film FE which is orthogonally crystalline is formed.

Figure 10:
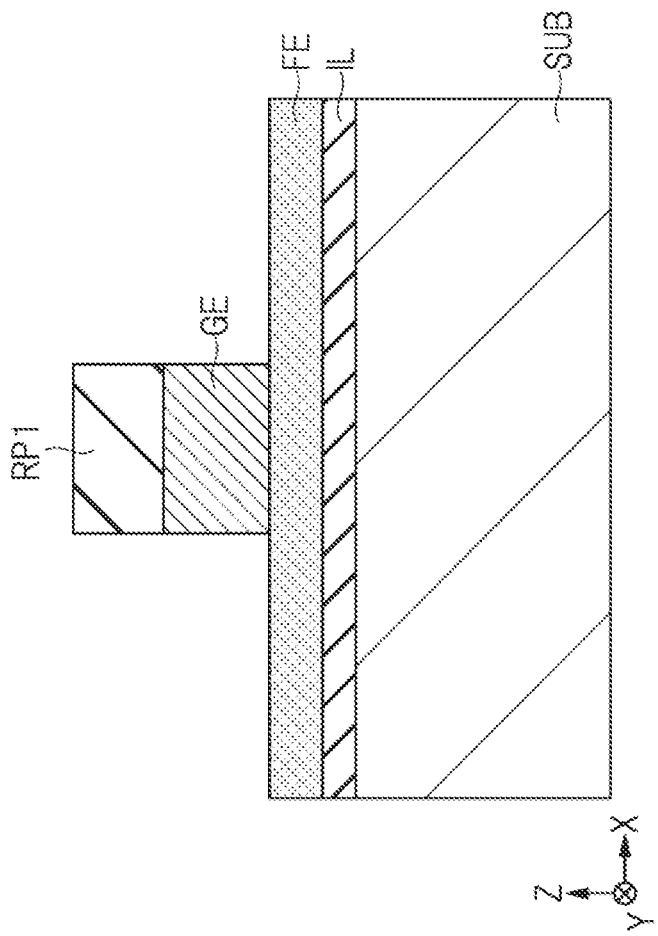
FIG. 10 is a cross-sectional view showing the manufacturing method of the semiconductor device following FIG. 9.

Next, as shown in FIG. 10, a resist pattern RP1 is formed on the conductive film CF. Next, an anisotropic plasma-etching is performed on the conductive film CF using the resist pattern RP1 as a mask. The gate electrode GE is formed by patterning the conductive film CF. After that, the resist pattern RP1 is removed by asking.

Figure 11:
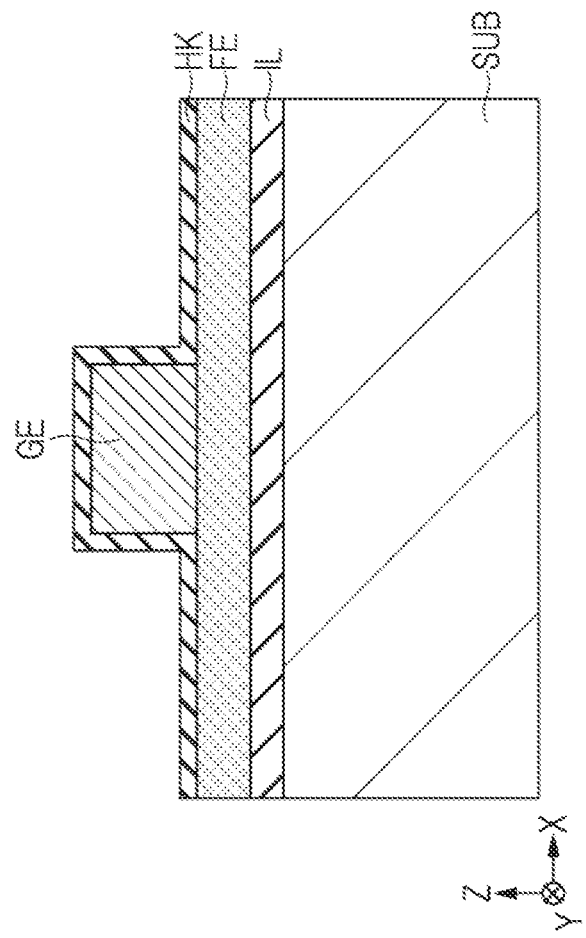
FIG. 11 is a cross-sectional view showing the manufacturing method of the semiconductor device following FIG. 10.

Next, as shown in FIG. 11, the high dielectric constant film HK is formed on the ferroelectric film FE by, for example, CVD method or ALD method so as to cover the gate electrode GE.

Figure 12:
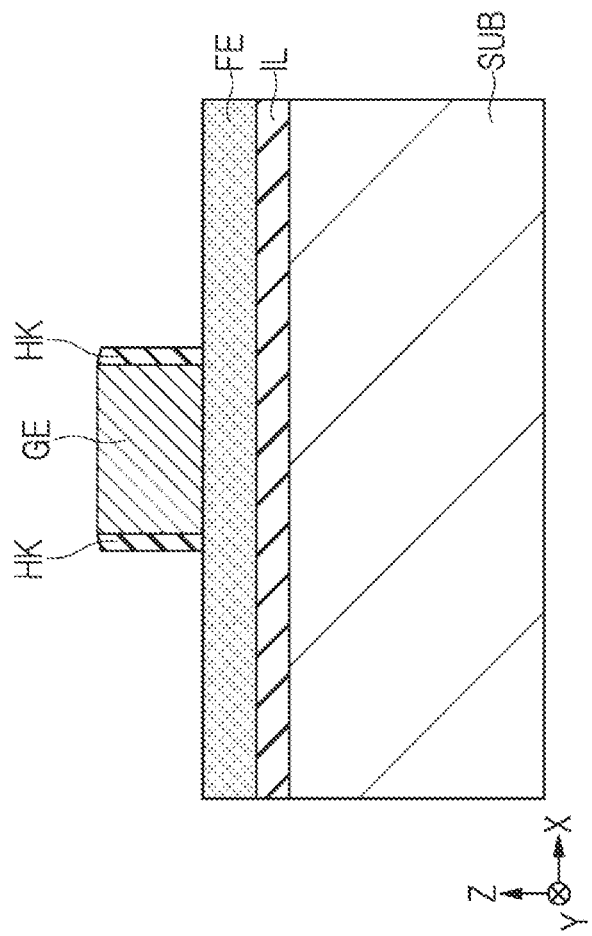
FIG. 12 is a cross-sectional view showing the manufacturing method of the semiconductor device following FIG. 11.

Next, as shown in FIG. 12, a portion of the high dielectric constant film HK is removed so that the high dielectric constant film HK remains on the side surfaces of the gate electrode GE by performing an anisotropic plasma-etching on the high dielectric constant film HK. At this time, a length of the high dielectric constant film HK in the gate length direction (X direction) is, for example, 10 to 20 nm.

Figure 13:
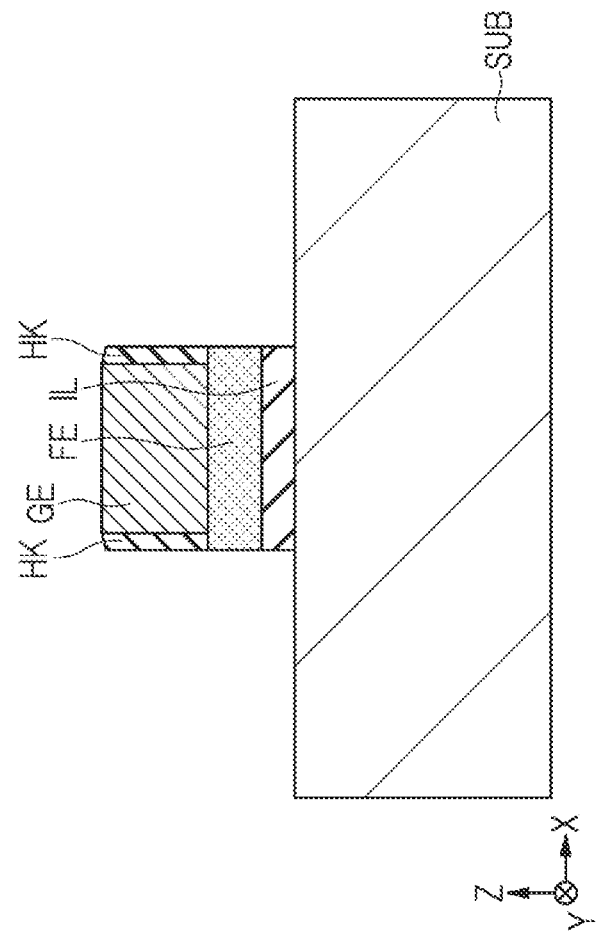
FIG. 13 is a cross-sectional view showing the manufacturing method of the semiconductor device following FIG. 12.

Next, as shown in FIG. 13, an anisotropic plasma-etching is performed on the ferroelectric film FE by using the gate electrode GE and the high dielectric constant film HK as masks. The plasma-etching is performed using etching gases, for example, such as a mixed gas containing CF4 and Ar or a mixed gas containing Cl2 and HBr. Accordingly, the ferroelectric film FE exposed from the gate electrode GE and the high dielectric constant film HK is removed. At this time, since the vicinity of the side surfaces of the ferroelectric film FE is exposed to plasma, the characteristic-variation portion FEa as described with reference to FIG. 7 is formed in the ferroelectric film FE located directly under the high dielectric constant film HK.

Next, the paraelectric film IL is patterned. For example, the paraelectric film IL exposed from the ferroelectric film FE is removed by wet etching using an aqueous solution containing hydrofluoric acid. By these steps, the area of the ferroelectric film FE and the area of the paraelectric film IL become larger than the area of the gate electrode GE in a plan view.

After that, the nonvolatile memory cell MC shown in FIG. 4 is formed through the following manufacturing steps.

First, an insulating film such as the silicon oxide film or the silicon nitride film is formed on the semiconductor substrate SUB by, for example, CVD method so as to cover the gate electrode GE, the high dielectric constant film HK, the ferroelectric film FE, and the paraelectric film IL. Next, by performing an anisotropic plasma-etching on the insulating film, a part of the insulating film is removed so as to remain the insulating film on the side surfaces of the gate electrode GE via the high dielectric constant film HK, the side surfaces of the ferroelectric film FE, and the side surfaces of the paraelectric film IL. The insulating film left in this manner becomes as the sidewall spacers SW.

Next, an impurity exhibiting n-type conductivity such as arsenic (As) or phosphorus (P) is introduced into the semiconductor substrate SUB by photolithography and ion implantation. As a result, the source region SR and the drain region DR are formed in the semiconductor substrate SUB so as to sandwich the semiconductor substrate SUB located under the ferroelectric film FE. After that, the semiconductor substrate SUB is processed to a heat treatment to diffuse and activate the impurities contained in the source region SR and the drain region DR. After that, although not shown, the nonvolatile memory cell MC is covered with an interlayer insulating film. And plugs reaching the gate electrode GE, the source region SR, and the drain region DR are formed in the interlayer insulating film.

Note that, although not shown, when the gate electrode GE is formed of the metal film instead of the polysilicon film, a gate last process may be employed. In that case, in the step of FIG. 9, a laminated film of the metal film such as the titanium nitride film and the polysilicon film are formed on the ferroelectric film FE as the conductive film CF. After the nonvolatile memory cell MC is covered with the interlayer insulating film, an upper surface of the polysilicon film is exposed by a polishing using CMP method. An opening is formed by removing the polysilicon film to expose the metal film (the titanium nitride film). The metal film such as the aluminum film or the tungsten film is formed on the titanium nitride film so as to fill the opening. In this manner, the laminated film made of a plurality of the metal films can also be applied as the gate electrode GE.

Second Embodiment

Hereinafter, a semiconductor device in a second embodiment will be described with reference to FIGS. 14 and 15. Note that, in the following description, differences from the first embodiment will be mainly described, and the description of overlapping points with the first embodiment will be omitted.

A nonvolatile memory cell MC of the second embodiment is also the ferroelectric memory cell having a MFMIS-FET structure same as the first embodiment. Therefore, as shown in FIG. 14, a metal film MF is formed between a ferroelectric film FE and a paraelectric film IL. The metal film MF is made of a metal material such as a titanium nitride film. And a thickness of the metal film MF is, for example, 3 to 10 nm.

Figure 15:
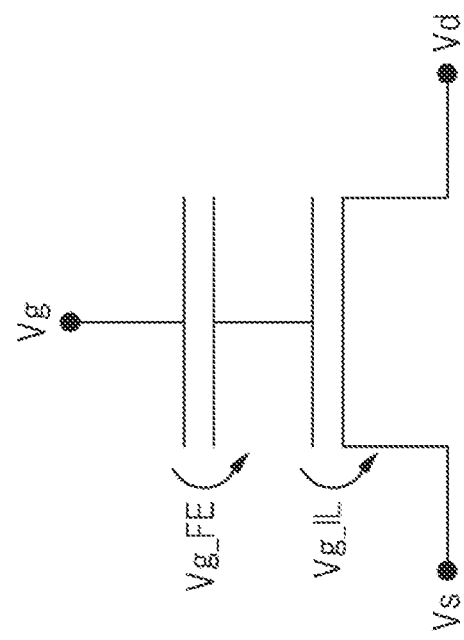
FIG. 15 is an equivalent circuit diagram of the nonvolatile memory cell in the second embodiment.

As shown in FIG. 15, a gate voltage Vg is applied to a gate electrode GE during a write operation and an erase operation of the nonvolatile memory cell MC, but the gate voltage Vg is divided into a gate voltage VgFE and a gate voltage VgIL in the ferroelectric film FE and the paraelectric film IL. In order to apply a voltage higher to the ferroelectric film FE, it is effective to relatively reduce a capacitance of the ferroelectric film FE and relatively increase the capacitance of the paraelectric film IL.

As one of the solutions for realizing the above, it is effective to change an area ratio of the gate electrode GE and the metal film MF. Therefore, in the second embodiment, an area of the paraelectric film IL and an area of the metal film MF are made larger than an area of the ferroelectric film FE and the area of the gate electrode GE in a plan view. In other words, in a gate length direction (X direction), a length of the ferroelectric film FE and a length of the gate electrode GE are longer than a length of the paraelectric film IL and a length of the metal film MF. That is, a contact area between the ferroelectric film FE and the metal film MF is reduced, and the contact area between the paraelectric film IL and the metal film MF is increased.

Also in the second embodiment, a high dielectric constant film HK is formed on the ferroelectric film FE so as to cover side surfaces of the gate electrode GE. Therefore, since the high dielectric constant film HK is formed on the side surfaces of the gate electrode GE, the area of the ferroelectric film FE is larger than the area of the gate electrode GE in plan view. In other words, in the gate length direction (X direction), the length of the ferroelectric film FE is longer than the length of the gate electrode GE.

An insulating film IF1 is formed between the high dielectric constant film HK and sidewall spacers SW. The insulating film IF1 is, for example, a silicon oxide film.

The metal film MF is electrically isolated from the gate electrode GE and a semiconductor substrate SUB, and is in a floating state during the write operation, the erase operation, and a read operation of the nonvolatile memory cell MC.

Note that the metal film MF may not be in the floating state. Although not shown, for example, a lead portion exposed from the gate electrode GE and the ferroelectric film FE may be provided in a part of the metal film MF, and a plug different from the plug connected to the gate electrode GE may be provided in the lead portion. As a result, during the write operation and the erase operation of the nonvolatile memory cell MC, the gate voltage Vg may be applied to the gate electrode GE, and a voltage that differs from the gate voltage Vg may be applied to the metal film MF.

In this case, in the write operation and the erase operation, a voltage (−Vg) having a magnitude opposite to that of the gate voltage Vg is applied to the metal film MF. In the read operation, the same voltage as the gate voltage Vg is applied to the metal film MF. As a result, the write operation, the erase operation, and the read operation of the nonvolatile memory cell MC can be performed. In this method, since the voltages applied to the gate electrode GE and the metal film MF can be controlled independently, a controllability of the nonvolatile memory cell MC can be improved. That is, in the paraelectric film IL, since division of the gate voltage Vg into the gate voltage VgIL can be reduced, it is possible to apply a higher voltage to the ferroelectric film FE.

In the second embodiment, as in the first embodiment, a characteristic-variation portion FEa is formed on the ferroelectric film FE as described with reference to FIG. 7. However, by covering the characteristic-variation portion FEa with the high dielectric constant film HK, it becomes easy to perform an accurate read operation even if a magnitude of the polarization of the characteristic variation portion FEa is difficult to change. That is, also in the second embodiment, a reliability of the nonvolatile memory cell MC can be improved.

A Manufacturing Method of the Semiconductor Device in the Second Embodiment

Hereinafter, a manufacturing method of the semiconductor device in the second embodiment will be described with reference to FIGS. 16 to 22.

Figure 16:
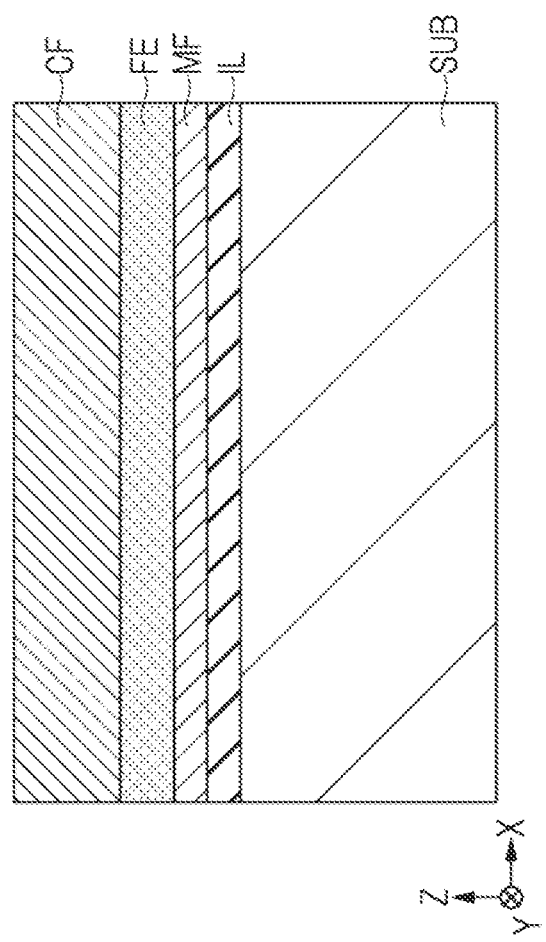
FIG. 16 is a cross-sectional view showing a manufacturing method of the semiconductor device in the second embodiment.

As shown in FIG. 16, first, the semiconductor substrate SUB is prepared. Next, the paraelectric film IL, the ferroelectric film FE, and a conductive film CF are sequentially formed on the semiconductor substrate SUB in the same manner as the first embodiment. In the second embodiment, the step of forming the metal film MF on the paraelectric film IL is performed between the step of forming the paraelectric film IL and the step of forming the ferroelectric film FE. The metal film MF is formed by, for example, CVD method or sputtering method.

Figure 17:
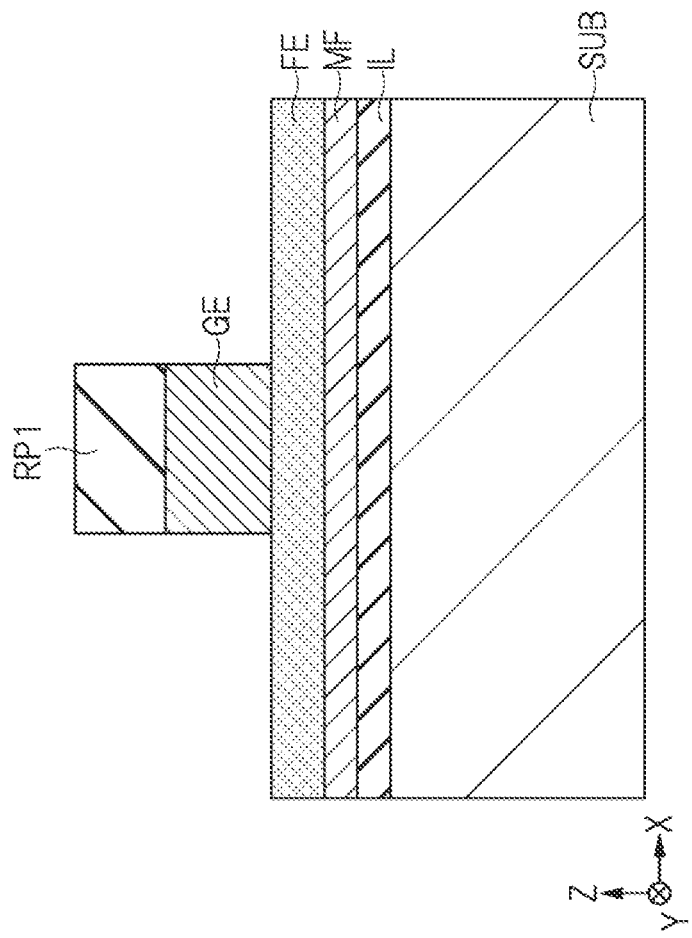
FIG. 17 is a cross-sectional view showing the manufacturing method of the semiconductor device following FIG. 16.

Next, as shown in FIG. 17, a resist pattern RP1 is formed on the conductive film CF, and the conductive film CF is patterned in the same manner as the first embodiment to form the gate electrode GE. After that, the resist pattern RP1 is removed by asking.

Figure 18:
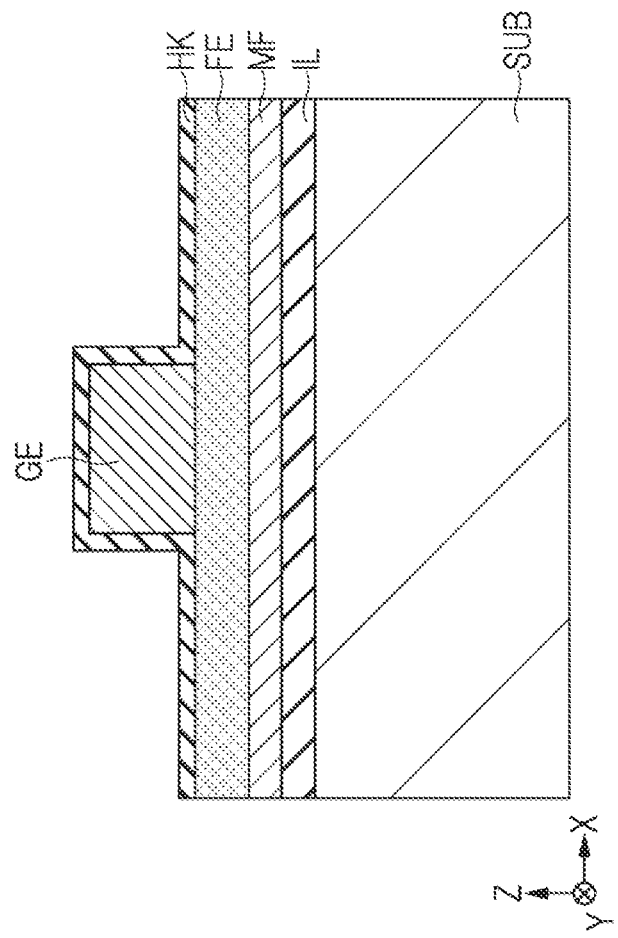
FIG. 18 is a cross-sectional view showing the manufacturing method of the semiconductor device following FIG. 17.

Next, as shown in FIG. 18, the high dielectric constant film HK is formed on the ferroelectric film FE so as to cover the gate electrode GE in the same manner as the first embodiment.

Figure 19:
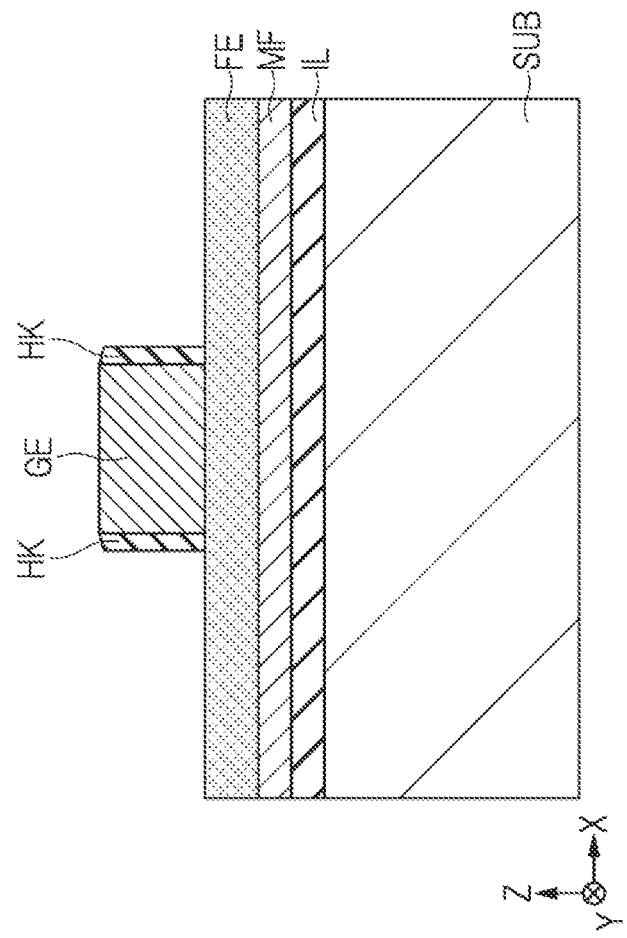
FIG. 19 is a cross-sectional view showing the manufacturing method of the semiconductor device following FIG. 18.

Next, as shown in FIG. 19, by performing an anisotropic plasma-etching on the high dielectric constant film HK, a part of the high dielectric constant film HK is removed so as to leave the high dielectric constant film HK on the side surfaces of the gate electrode GE.

Figure 20:
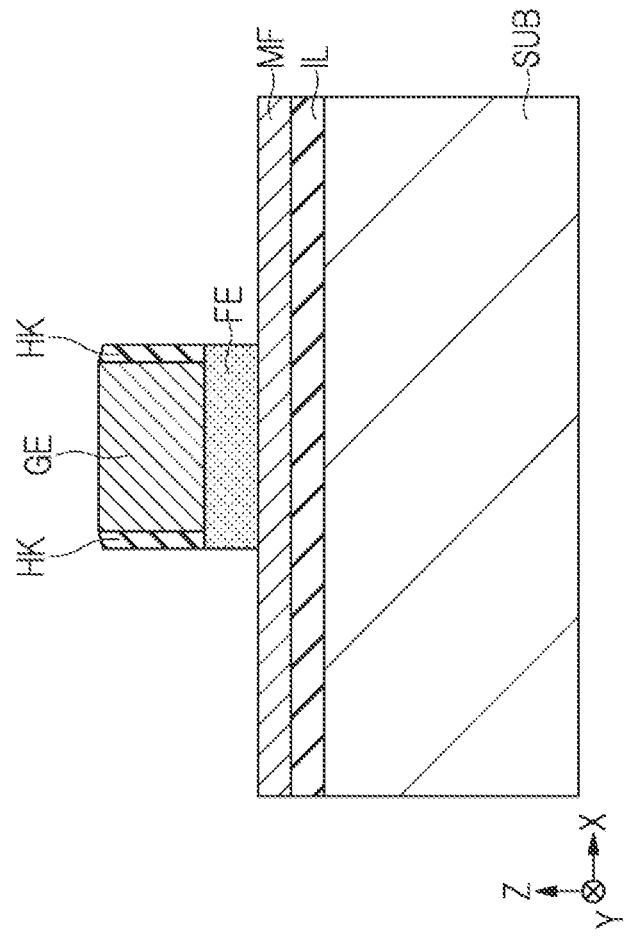
FIG. 20 is a cross-sectional view showing the manufacturing method of the semiconductor device following FIG. 19.

Next, as shown in FIG. 20, the ferroelectric film FE is processed to an anisotropic plasma-etching using the gate electrode GE and the high dielectric constant film HK as masks. Accordingly, the ferroelectric film FE exposed from the gate electrode GE and the high dielectric constant film HK is removed. By this step, the area of the ferroelectric film FE is larger than the area of the gate electrode GE in a plan view.

Figure 21:
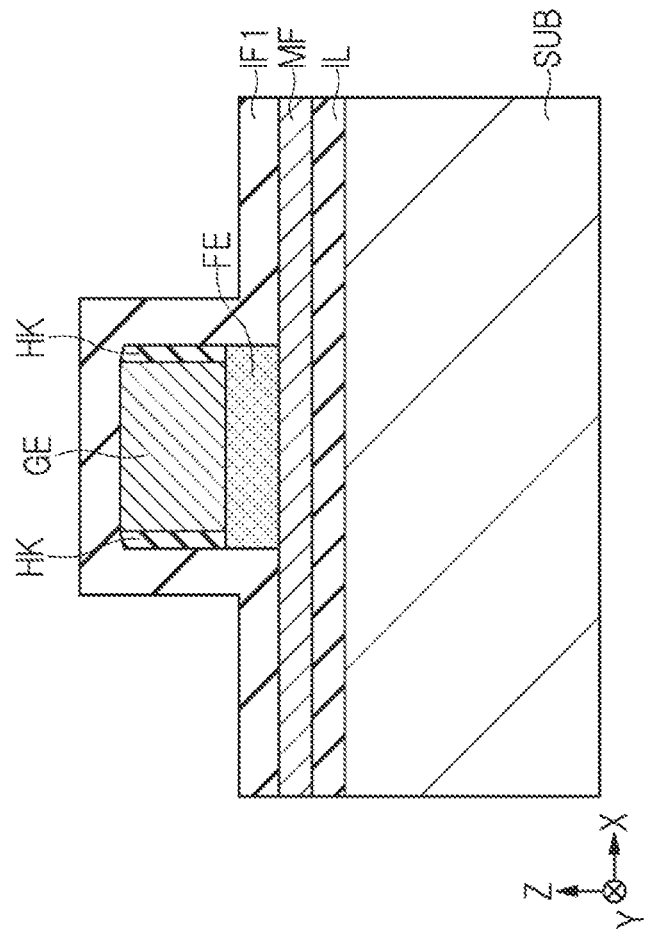
FIG. 21 is a cross-sectional view showing the manufacturing method of the semiconductor device following FIG. 20.

Next, as shown in FIG. 21, the insulating film IF1 is formed on the metal film MF by, for example, CVD method so as to cover the gate electrode GE, the high dielectric constant film HK, and the ferroelectric film FE.

Figure 22:
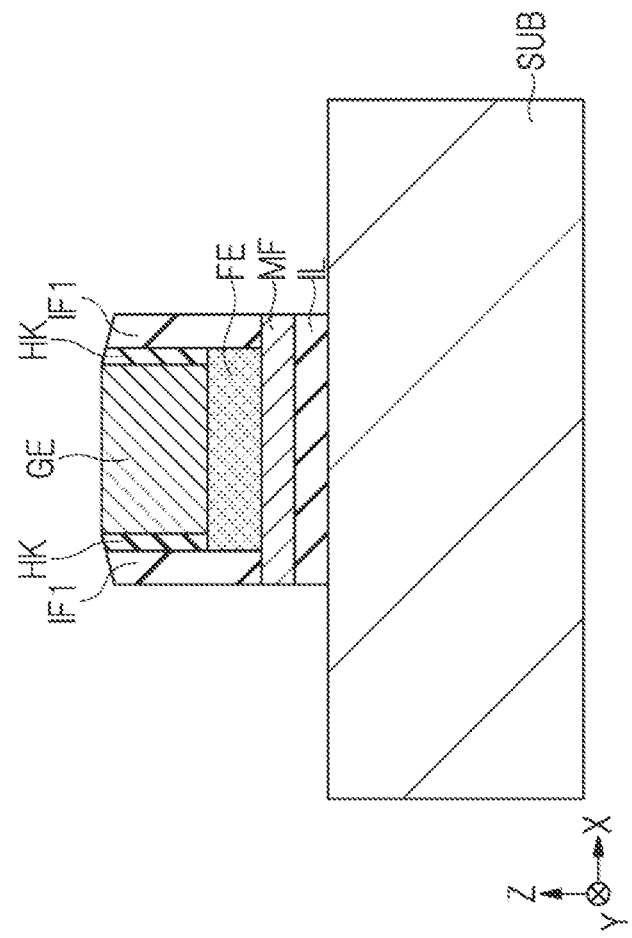
FIG. 22 is a cross-sectional view showing the manufacturing method of the semiconductor device following FIG. 21.

Next, as shown in FIG. 22, the insulating film IF1 is partially removed so as to remain the insulating film IF1 on the side surfaces of the ferroelectric film FE by performing an anisotropic plasma-etching on the insulating film IF1. At this time, a length of the insulating film IF1 in the gate length direction (X direction) is, for example, 15 to 25 nm.

Next, the metal film MF is patterned. An anisotropic plasma-etching is performed on the ferroelectric film FE by using the gate electrode GE, the high dielectric constant film HK, and the insulating film IF1 as masks. Accordingly, the metal film MF exposed from the gate electrode GE, the high dielectric constant film HK, and the insulating film IF1 is removed.

Next, the paraelectric film IL is patterned. The paraelectric film IL is processed to wet etching using, for example, an aqueous solution containing hydrofluoric acid by using the gate electrode GE, the high dielectric constant film HK, and the insulating film IF1 as masks. Accordingly, the paraelectric film IL exposed from the gate electrode GE, the high dielectric constant film HK, and the insulating film IF1 is removed. By these steps, the area of the metal film MF and the area of the paraelectric film IL are larger than the area of the ferroelectric film FE and the area of the gate electrode GE in a plan view.

Figure 14:
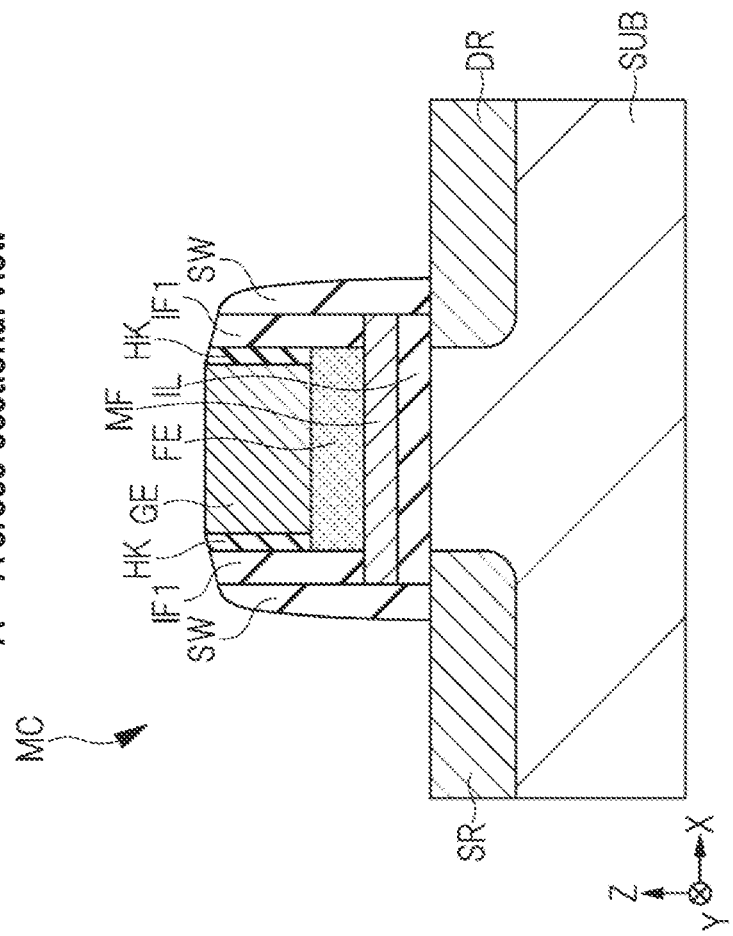
FIG. 14 is a cross-sectional view showing a semiconductor device having a nonvolatile memory cell in a second embodiment.

After that, the sidewall spacers SW, a source region SR, and a drain region DR are formed in the same manner as the first embodiment, thereby forming the nonvolatile memory cell MC shown in FIG. 14.

Note that when the gate electrode GE is formed of a metal film instead of a polysilicon film, the gate last process may be employed as the first embodiment.

Although the present invention has been described in detail based on the above-described embodiments, the present invention is not limited to the above-described embodiments, and can be variously modified without departing from the gist thereof.

What is claimed is:

1. A semiconductor device comprising nonvolatile memory cells, wherein the nonvolatile memory cell comprising:
   a paraelectric film formed over a semiconductor substrate;
   a ferroelectric film formed over the paraelectric film;
   a gate electrode formed over the ferroelectric film;
   a high dielectric constant film formed over the ferroelectric film such that the high dielectric constant film covers side surfaces of the gate electrode; and
   a source region and a drain region formed in an upper surface of the semiconductor substrate such that the ferroelectric film is sandwiched between the source region and the drain region in plan view,
   wherein a relative dielectric constant of the high dielectric constant film is higher than a relative dielectric constant of the ferroelectric film.

2. The semiconductor device according to claim 1, wherein an area of the ferroelectric film is bigger than an area of the gate electrode in plan view.

3. The semiconductor device according to claim 1, wherein a metal film is formed between the ferroelectric film and the paraelectric film.

4. The semiconductor device according to claim 3, wherein an area of the ferroelectric film is bigger than an area of the gate electrode in plan view,
   wherein an area of the metal film and an area of the paraelectric film are bigger than the area of the ferroelectric film in plan view.

5. The semiconductor device according to claim 1, wherein the ferroelectric film is an orthorhombic crystal HfO2 film or an orthorhombic crystal HfO2 film contained at least one of Zr, Si, N, C and Al.

6. The semiconductor device according to claim 5, wherein the high dielectric constant film is a titanium oxide film.

* * * * *